(12) United States Patent
Briggs et al.

(10) Patent No.: US 10,211,153 B2
(45) Date of Patent: Feb. 19, 2019

(54) LOW ASPECT RATIO INTERCONNECT

(71) Applicant: International Business Machines Corporation, Armonk, NY (US)

(72) Inventors: Benjamin D. Briggs, Waterford, NY (US); Elbert E. Huang, Carmel, NY (US); Raghuveer R. Patlolla, Guilderland, NY (US); Cornelius Brown Peethala, Albany, NY (US); David L. Rath, Stormville, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/251,775

(22) Filed: Aug. 30, 2016

(65) Prior Publication Data

US 2018/0061761 A1 Mar. 1, 2018

(51) Int. Cl.
*H01L 23/528* (2006.01)
*H01L 23/522* (2006.01)
(Continued)

(52) U.S. Cl.
CPC ...... *H01L 23/5283* (2013.01); *H01L 21/7684* (2013.01); *H01L 21/76804* (2013.01);
(Continued)

(58) Field of Classification Search
CPC ........... H01L 23/5283; H01L 23/53223; H01L 21/7684; H01L 21/76834; H01L 21/76804;
(Continued)

(56) References Cited

U.S. PATENT DOCUMENTS 5,676,587 A 10/1997 Landers et al.
6,086,777 A * 7/2000 Cheng .................. C23F 4/00
216/67
(Continued)

FOREIGN PATENT DOCUMENTS

CN 103985670 A 8/2014

OTHER PUBLICATIONS

Krishnan et al., "Chemical Mechanical Planarization: Slurry Chemistry, Materials, and Mechanisms", Chemical reviews, 110(1), 2009, pp. 178-204.

*Primary Examiner* — Latanya N Crawford
(74) *Attorney, Agent, or Firm* — Cantor Colburn LLP; Vazken Alexanian

(57) ABSTRACT

A low aspect ratio interconnect is provided and includes a metallization layer, a liner and a metallic interconnect. The metallization layer includes bottommost and uppermost surfaces. The uppermost surface has a maximum post-deposition height from the bottommost surface at first metallization layer portions. The metallization layer defines a trench at second metallization layer portions. The liner includes is disposed to line the trench and includes liner sidewalls that have terminal edges that extend to the maximum post-deposition height and lie coplanar with the uppermost surface at the first metallization layer portions. The metallic interconnect is disposed on the liner to fill a trench remainder and has an uppermost interconnect surface that extends to the maximum post-deposition height and lies coplanar with the uppermost surface at the first metallization layer portions.

13 Claims, 3 Drawing Sheets

(51) Int. Cl.
*H01L 23/532* (2006.01)
*H01L 21/768* (2006.01)

(52) U.S. Cl.
CPC .. *H01L 21/76816* (2013.01); *H01L 21/76834* (2013.01); *H01L 21/76846* (2013.01); *H01L 21/76873* (2013.01); *H01L 21/76879* (2013.01); *H01L 23/5226* (2013.01); *H01L 23/53209* (2013.01); *H01L 23/53238* (2013.01); *H01L 23/53266* (2013.01)

(58) Field of Classification Search
CPC ......... H01L 21/76879; H01L 21/76816; H01L 21/76846; H01L 23/53266; H01L 23/53209; H01L 23/53238; H01L 23/5226; H01L 21/76873
See application file for complete search history.

(56) References Cited

U.S. PATENT DOCUMENTS

| | | | |
|---|---|---|---|
| 6,375,693 B1 | 4/2002 | Cote et al. | |
| 6,790,336 B2* | 9/2004 | Andryushchenko | H01L 21/7684 205/220 |
| 6,939,795 B2 | 9/2005 | Eissa et al. | |
| 7,422,983 B2 | 9/2008 | Cotte et al. | |
| 7,935,242 B2 | 5/2011 | Klein | |
| 8,012,879 B2 | 9/2011 | Rusli | |
| 8,129,269 B1* | 3/2012 | Bao | H01L 21/02126 257/E21.273 |
| 9,074,286 B2 | 7/2015 | Mayer et al. | |
| 9,530,737 B1* | 12/2016 | Fu | H01L 21/76805 |
| 2003/0234182 A1* | 12/2003 | Andryushchenko | H01L 21/7684 205/157 |
| 2004/0262764 A1* | 12/2004 | Gambino | H01L 21/76807 257/758 |
| 2005/0070211 A1 | 3/2005 | Bian | |
| 2007/0020918 A1* | 1/2007 | Hirokawa | B23H 5/08 438/626 |
| 2007/0023912 A1* | 2/2007 | Wang | H01L 21/76807 257/750 |
| 2007/0238287 A1* | 10/2007 | Greeley | H01L 21/32134 438/629 |
| 2008/0248656 A1* | 10/2008 | Chen | H01L 21/02063 438/798 |
| 2009/0017616 A1* | 1/2009 | Grunow | H01L 21/31144 438/656 |
| 2013/0333923 A1* | 12/2013 | Balseanu | C23C 16/345 174/251 |
| 2014/0042642 A1* | 2/2014 | Chen | H01L 23/5283 257/775 |
| 2015/0348832 A1 | 12/2015 | Bruce et al. | |
| 2016/0118292 A1* | 4/2016 | He | H01L 21/7682 257/773 |
| 2016/0300730 A1* | 10/2016 | Wu | H01L 21/02074 |
| 2017/0092591 A1* | 3/2017 | Fu | H01L 21/76805 |
| 2017/0219771 A1* | 8/2017 | Zhang | G02B 6/0288 |
| 2017/0222055 A1* | 8/2017 | Chang | H01L 21/3065 |

* cited by examiner

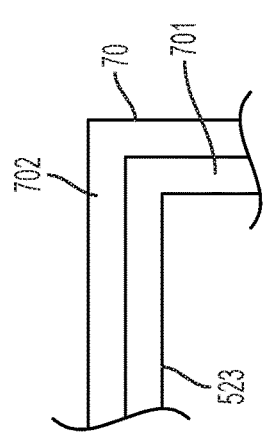
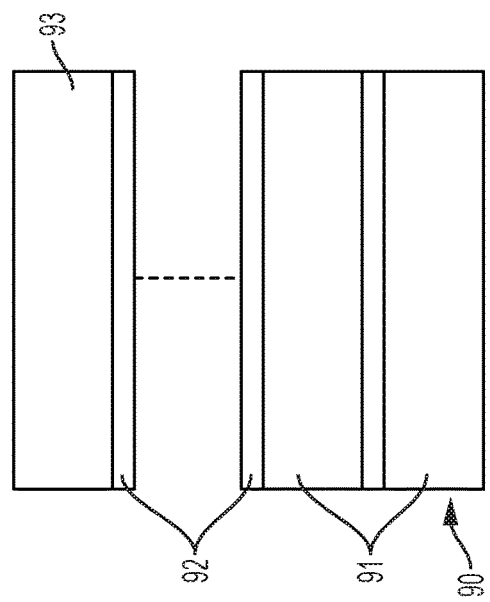
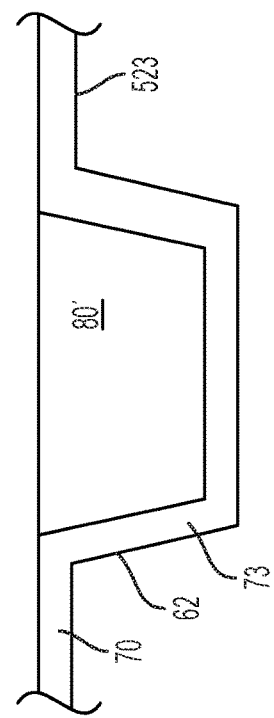

LOW ASPECT RATIO INTERCONNECT

BACKGROUND

The present invention relates to semiconductor devices and, more specifically, to a low aspect ratio interconnect, formation of low aspect ratio interconnects and formation of a device with multiple low aspect ratio interconnects.

In semiconductor device manufacturing, it is often necessary to assemble devices with multiple metallization levels. Each level includes a dielectric body formed to define a trench, a trench liner and a metallic interconnect disposed within the trench. This metallic interconnect is made of a conductive material that exhibits changes in grain character throughout the manufacturing processes. This grain character influences performance capabilities of the metallic interconnect.

The grain characteristics relate to the orientations and sizes of individual grains of the metallic interconnect material, among other characteristics. The performance capabilities of the metallic interconnect include its resistivity, which can increase as a result of the metallic interconnect material having generally smaller grain sizes or decrease as a result of the metallic interconnect material having generally large grain sizes.

SUMMARY

According to a non-limiting embodiment of the present invention, a low aspect ratio interconnect is provided and includes a metallization layer, a liner and a metallic interconnect. The metallization layer includes bottommost and uppermost surfaces. The uppermost surface has a maximum post-deposition height from the bottommost surface at first metallization layer portions. The metallization layer defines a trench at second metallization layer portions. The liner includes is disposed to line the trench and includes liner sidewalls that have terminal edges that extend to the maximum post-deposition height and lie coplanar with the uppermost surface at the first metallization layer portions. The metallic interconnect is disposed on the liner to fill a trench remainder and has an uppermost interconnect surface that extends to the maximum post-deposition height and lies coplanar with the uppermost surface at the first metallization layer portions.

According to another non-limiting embodiment, a method of forming a low aspect ratio interconnect is provided and includes polishing metallic interconnect material to an upper portion of a liner and an uppermost surface of a metallic interconnect, stopping the polishing once the upper portion of the liner and the uppermost surface of the metallic interconnect are reached and etching liner material at the upper portion of the liner and the metallic interconnect material at the uppermost surface of the metallic interconnect to an uppermost surface of a metallization layer.

According to yet another non-limiting embodiment, a method of forming a device with multiple low aspect ratio interconnects is provided. The method includes forming multiple lower interconnect layers with lower trenches, lower trench liners and lower metallic interconnects, depositing a cap on each of the multiple lower interconnect layers, disposing a metallization layer on an uppermost cap, the metallization layer comprising metallic interconnect material disposed over a liner deposited on metallization layer material defining a trench, polishing the metallic interconnect material to an upper portion of the liner and an uppermost surface of a metallic interconnect and etching liner material at the upper portion of the liner and the metallic interconnect material at the uppermost surface of the metallic interconnect to an uppermost surface of the metallization layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-15 are a series of views illustrating a low aspect ratio interconnect and formation of a low aspect ratio interconnect according to exemplary embodiments of the present teachings, in which:

FIG. 1 is an initial stage of a known interconnect formation;

FIG. 2 is a first intermediate stage of the known interconnect formation;

FIG. 3 is a second intermediate stage of the known interconnect formation;

FIG. 4 is a fourth intermediate stage of the known interconnect formation;

FIG. 5 is a fifth intermediate stage of the known interconnect formation;

FIG. 6 is a final stage of the known interconnect formation;

FIG. 7 is an initial stage of a low aspect ratio interconnect formation in accordance with one or more embodiments;

FIG. 8 is an intermediate stage of a low aspect ratio interconnect formation in accordance with one or more embodiments;

FIG. 9 is another intermediate stage of a low aspect ratio interconnect formation in accordance with one or more embodiments;

FIG. 10 is an enlarged side view of a liner of the low aspect ratio interconnect according to one or more embodiments;

FIG. 11 is another intermediate stage of a low aspect ratio interconnect formation in accordance with one or more embodiments;

FIG. 12 is another intermediate stage of a low aspect ratio interconnect formation in accordance with one or more embodiments;

FIG. 13 is another stage of a low aspect ratio interconnect formation in accordance with one or more embodiments;

FIG. 14 is an enlarged side view of a trench, liner sidewalls and a metallic interconnect in accordance with one or more embodiments; and FIG. 15 is a side view of a device with multiple low aspect ratio interconnects in accordance with one or more embodiments.

DETAILED DESCRIPTION

Figure 1:
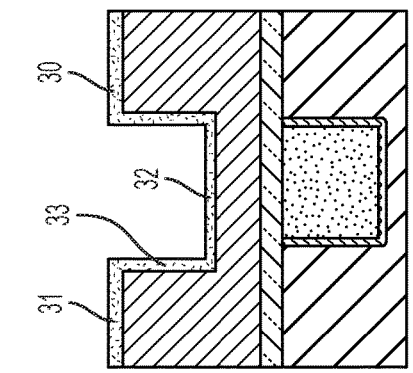

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present invention, one or more embodiments relate to processes for formation of a low aspect ratio metallic interconnect including a single chemical mechanical polishing (CMP) operation to planarize a metallization layer with a trench, a liner and metallic interconnect material and an etching process following the single CMP operation to remove an upper portion of the liner and the metallic interconnect material.

With reference to FIGS. 1-6, a conventional method of forming a metallic interconnect is provided for comparison sake.

As shown in FIG. 1, the method begins with a basic structure already provided. The basic structure includes a contact or lower metallization level (M0) 10, a cap 11 disposed over the lower metallization level 10, an upper metallization level (M1) 12 and a hard mask 13. The lower metallization level 10 has a body 101 that is formed of a dielectric, such as silicon oxide. The body 101 is formed to define a lower trench 14 that has a bottom lower trench wall 140 and lower trench sidewalls 141 extending upwardly from the bottom lower trench wall 140. The lower metallization level 10 further includes a lower trench liner (for example tantalum, tantalum nitride, cobalt, ruthenium) 15, which is formed of a dielectric material and which lines the bottom lower trench wall 140 and the lower trench sidewalls 141, and a lower metallic interconnect 16. The lower metallic interconnect 16 can be formed of a metallic material, such as tungsten, and fills a remainder of the space within the lower trench 14 that is not taken up by the lower trench liner 15. The cap 11 can be formed of a dielectric material, such as silicon nitride or silicon carbon nitride, and lies over an uppermost surface of the body 101, terminal edges of the lower trench liner 15 and an uppermost surface of the lower metallic interconnect 16. The cap 11 can have a substantially constant thickness such that its bottommost and uppermost surfaces are substantially parallel.

The upper metallization level 12 has a main body 121 that is formed of an ultra low-k (ULK) dielectric, such as carbon-doped silicon oxide, porous silicon dioxide, porous carbon-doped silicon dioxide or another similar material. The main body 121 has a bottommost surface 122 that lies atop the cap 11 and an uppermost surface 123 opposite the bottommost surface 122. Upon formation of the main body 121, the uppermost surface 123 has an initial height of H1 as measured from the bottommost surface 122. The hard mask 13 can be formed of a silicon nitride layer 130, which lies atop the uppermost surface 123, and a titanium nitride layer 131, which lies atop the silicon nitride layer 130. The titanium nitride layer 131 is formed to define an aperture 132 whereby a corresponding portion of the silicon nitride layer 130 is exposed.

Figure 2:
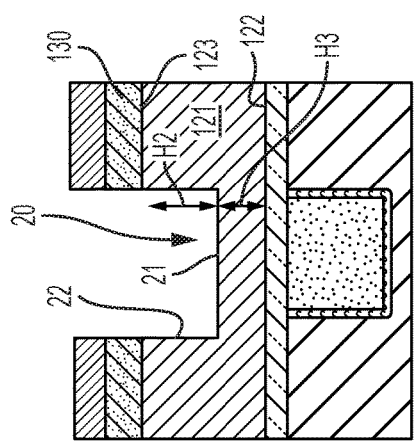

As shown in FIG. 2, in a first intermediate stage of the formation of the metallic interconnect, a trench 20 is formed by a trench etch process. The trench etch process removes the exposed portion of the silicon nitride layer 130 and a corresponding portion of the main body 121. The trench etch process can be performed as a reactive ion etch (RIE). In any case, as a result of the trench etch process, the trench 20 is formed and includes a bottom trench wall 21 and trench sidewalls 22 extending upwardly from the bottom trench wall 21. A height of the trench 20 as measured from the uppermost surface 123 to the bottom trench wall 21 is H2 and a height of the bottom trench wall 21 to the bottommost surface 122 is H3 where H1=H2+H3.

Figure 3:
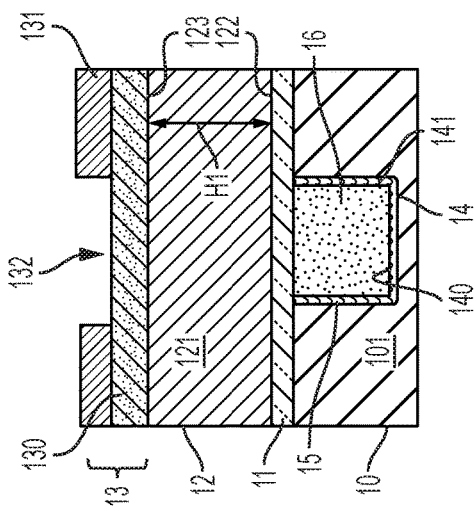

As shown in FIG. 3, once the trench 20 is formed, the remaining portions of the hard mask 13 are removed and a liner 30 is deposited on the now exposed surfaces of the main body 121. The liner 30 can be formed of tantalum nitride, tantalum, cobalt, ruthenium or another similar material and can include one or more discrete layers. In any case, the liner 30 includes upper portions 31 that lie atop the uppermost surface 123, a bottom liner wall 32 that lies atop the bottom trench wall 21 and liner sidewalls 33 that run along the trench sidewalls 22.

Figure 4:
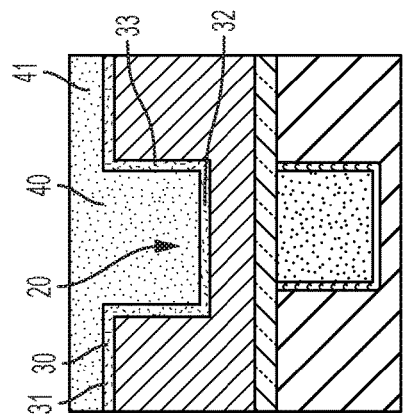

As shown in FIG. 4, metallic interconnect material is deposited over the liner 30 as a seed 40 and a plate 41. The metallic interconnect material can include copper, cobalt or ruthenium and can be deposited by physical vapor deposition (PVD), chemical vapor deposition (CVD) or another similar process. The seed 40 fills the remaining space of the trench 20 that is not occupied by the bottom liner wall 32 and the liner sidewalls 33. The plate 41 lies atop the upper portions 31, the liner sidewalls 33 and an uppermost surface of the seed 40.

Figure 5:
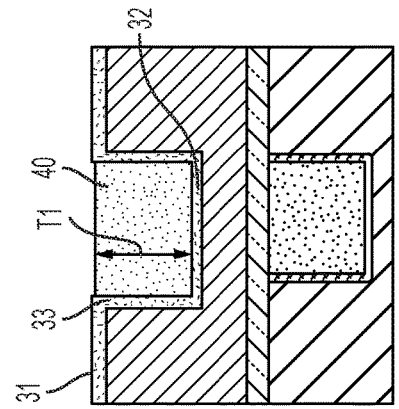

As shown in FIG. 5, a first chemical mechanical polish (CMP) process is performed to remove the plate 41 and to thus expose the upper portions 31, the liner sidewalls 33 and the uppermost surface of the seed 40. At this point, it is seen that an initial thickness T1 of the seed 40 is equal to the height H2 minus a thickness of the bottom liner wall 32.

Figure 6:
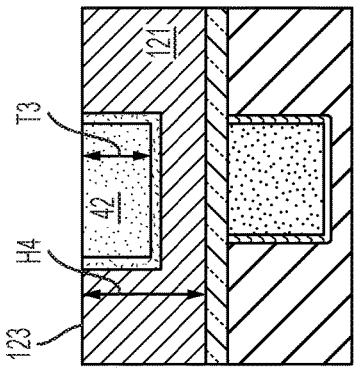

As shown in FIG. 6, a second CMP process is performed to remove the upper portions 31 and an upper section of the main body 121 as well as corresponding sections of the liner sidewalls 33 and the seed 40. The remainder 42 of the seed 40 is ultimately provided as a metallic interconnect for the upper metallization level 12. If one assumes that a thickness of the upper section of the main body 121 that is removed by the second CMP process is T2, a result of the second CMP process is that the uppermost surface 123 has a final height H4 of H1 minus T2 and that a final thickness T3 of the seed 40 is T1 minus T2.

With the above in mind, if one assumes that the height of the bottom trench wall 21 to the bottommost surface 122 is H3 (see FIG. 2) and must be provided as a minimum height, and if one assumes that the final thickness T3 of the seed 40 needs to be similarly provided as a minimum thickness, the initial height H1 of the uppermost surface 123 must be greater than the final height H4 and the initial thickness T1 of the seed 40 must be greater than the final thickness T3 of the seed 40 in order to accommodate the second CMP process. Such an initial thickness T1 of the seed 40 relative to its width, which is assumed to be consistent between the known process shown in FIGS. 1-6 and the embodiments of the invention shown in FIGS. 7-13, can therefore permit the metallic interconnect of the upper metallization level 12 to be characterized as a high aspect ratio metallic interconnect and leads to the formation of smaller grains in the remainder 42, which are associated with higher resistivity, as well as metallization voids and poor liner/seed conformity.

With reference to FIGS. 7-13, a method of forming a metallic interconnect is provided in accordance with embodiments.

Figure 7:
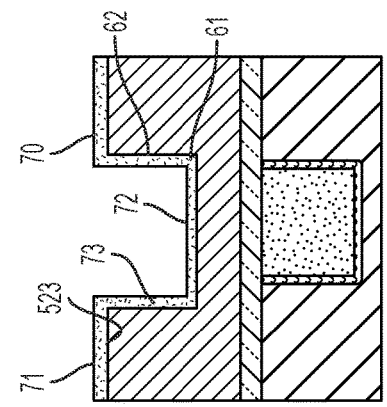

As shown in FIG. 7, the method begins with a basic structure already provided. The basic structure includes a contact or lower metallization level (M0) 50, a cap 51 disposed over the lower metallization level 50, an upper metallization level (M1) 52 and a hard mask 53. The lower metallization level 50 has a body 501 that is formed of a dielectric, such as silicon oxide. The body 501 is formed to define a lower trench 54 that has a bottom lower trench wall 540 and lower trench sidewalls 541 extending upwardly from the bottom lower trench wall 540. The lower metallization level 50 further includes a lower trench liner 55, which is formed of a dielectric material and which lines the bottom lower trench wall 540 and the lower trench sidewalls 541, and a lower metallic interconnect 56. The lower metallic interconnect 56 can be formed of a metallic material, such as tungsten, and fills a remainder of the space within the lower trench 54 that is not taken up by the lower trench liner 55. The cap 51 can be formed of a dielectric material, such as silicon nitride or silicon carbon nitride, and lies over an uppermost surface of the body 501, terminal edges of the lower trench liner 55 and an uppermost surface of the lower metallic interconnect 56. The cap 51 can have a substantially constant thickness such that its bottommost and uppermost surfaces are substantially parallel.

The upper metallization level 52 has a main body 521 that is formed of an ultra low-k (ULK) dielectric, such as carbon-doped silicon oxide, porous silicon dioxide, porous carbon-doped silicon dioxide or another similar material. The main body 521 has a bottommost surface 522 that lies atop the cap 51 and an uppermost surface 523 opposite the bottommost surface 522. Upon formation of the main body 521, the uppermost surface 523 has an initial post-deposition maximum height of H1 as measured from the bottommost surface 522 at first portions 524 of the main body 521. The hard mask 53 can be formed of a silicon nitride layer 530, which lies atop the uppermost surface 523, and a titanium nitride layer 531, which lies atop the silicon nitride layer 530. The titanium nitride layer 531 is formed to define an aperture 532 whereby a corresponding portion of the silicon nitride layer 530 is exposed.

Figure 8:
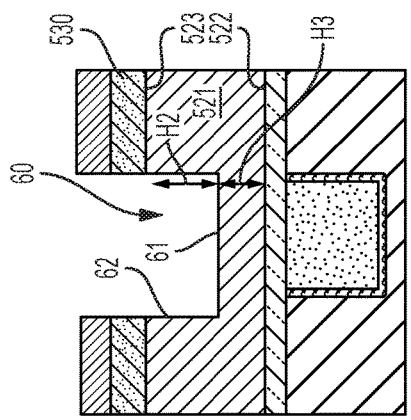

As shown in FIG. 8, in a first intermediate stage of the formation of the metallic interconnect, a trench 60 is formed in second portions 525 of the main body 521 by a trench etch process. The trench etch process removes the exposed portion of the silicon nitride layer 530 and a corresponding sectional portion of the main body 521. The trench etch process can be performed as a reactive ion etch (RIE). In any case, as a result of the trench etch process, the trench 60 is formed and includes a bottom trench wall 61 and trench sidewalls 62 extending upwardly from the bottom trench wall 61. A height of the trench 60 as measured from the uppermost surface 523 to the bottom trench wall 1 is H2 and a height of the bottom trench wall 61 to the bottommost surface 522 is H3 where H1=H2+H3.

Figure 9:
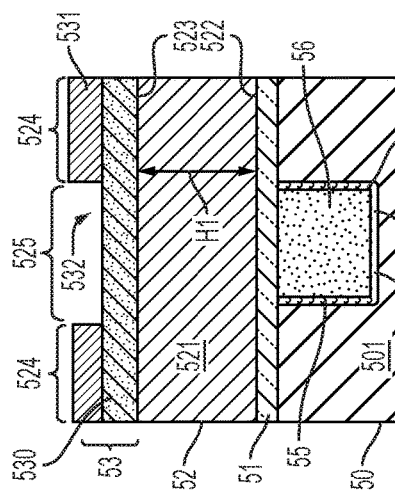

As shown in FIG. 9, once the trench 60 is formed, the remaining portions of the hard mask 53 are removed and a liner 70 is deposited on the now exposed surfaces of the main body 521. As shown in FIG. 10, the liner 70 can be formed of tantalum nitride, tantalum, cobalt, ruthenium or another similar material and can include one or more discrete layers 701, 702 of similar or differing materials (e.g., layer 701 can include tantalum nitride and layer 702 can include tantalum, cobalt, ruthenium). In any case, the liner 70 includes upper portions 71 that lie atop the uppermost surface 523, a bottom liner wall 72 that lies atop the bottom trench wall 61 and liner sidewalls 73 that run along the trench sidewalls 62.

Figure 11:
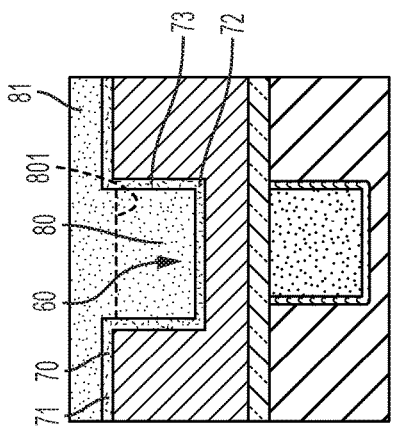

As shown in FIG. 11, metallic interconnect material is deposited over the liner 70 as a seed 80 and a plate 81. The metallic interconnect material can include copper, cobalt or ruthenium and can be deposited by physical vapor deposition (PVD), chemical vapor deposition (CVD) or another similar process. The seed 80 fills the remaining space of the trench 60 that is not occupied by the bottom liner wall 72 and the liner sidewalls 73. The plate 81 lies atop the upper portions 71, the liner sidewalls 73 and an uppermost surface 801 of the seed 80.

Figure 12:
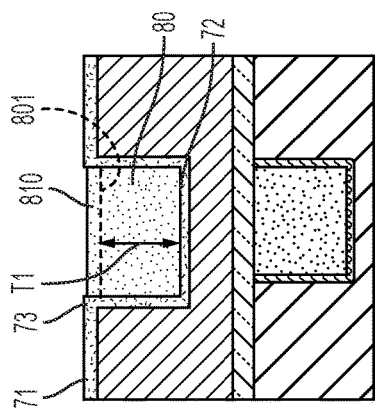

As shown in FIG. 12, a first chemical mechanical polish (CMP) process is performed to remove most of the plate 81 and to thus expose the upper portions 71, the liner sidewalls 73 and a remainder 810 of the plate 81. At this point, it is seen that an initial thickness T1 of the seed 80 is equal to the height H2 minus a thickness of the bottom liner wall 72.

Figure 13:
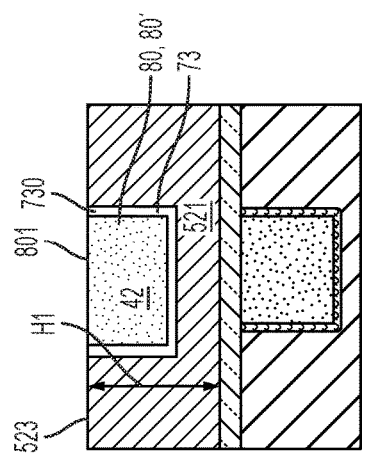

As shown in FIG. 13, a wet etch process is performed to remove the upper portions 71 as well as corresponding sections of the liner sidewalls 73 and the seed 80 such that terminal edges 730 of the liner sidewalls 73 and the uppermost surface 801 of the seed 80 are coplanar with each other and with the uppermost surface 523 of the main body 521. That is, the uppermost surface 801 of the seed 80 and the terminal edges 730 of the liner sidewalls 73 have a height that is substantially similar to the height of the uppermost surface 523 of the main body 521. Here, that height is the initial post-deposition maximum height H1.

The wet etch process of FIG. 13 is selective to the ULK dielectric of the main body 521 and thus does not remove any portion of the main body 521. The seed 80 is its own remainder and is ultimately provided as a metallic interconnect 80' for the upper metallization level 52. If one assumes that a thickness of the upper section of the main body 521 is unchanged due to the wet etch process being selective to the ULK dielectric of the main body 521, a result of the wet etch process is that the uppermost surface 523, the terminal edges 730 of the liner sidewalls 73 and the uppermost surface 801 of the seed 80 all have a final height H1, which is unchanged from the post-deposition maximum height of H1, and that the seed 80 has a final thickness of T1 (see FIG. 8).

With the above in mind, if one assumes that the height of the bottom trench wall 61 to the bottommost surface 522 is H3 (see FIG. 8) and must be provided as a minimum height, and if one assumes that the final thickness T1 of the seed 80 needs to be similarly provided as a minimum thickness, the final height H1 of the uppermost surface 123 and the final thickness T1 of the seed 80 are unchanged from their initial values. Such initial and final thicknesses T1 of the seed 80 relative to its width, which is assumed to be consistent between the embodiments of FIGS. 1-6 and those of FIGS. 7-13, can therefore permit the metallic interconnect 80' of the upper metallization level 52 to be characterized as a low aspect ratio metallic interconnect and leads to the formation of larger grains in the seed 80, which are associated with lower resistivity, as well as reduced metallization voids and improved liner/seed conformity.

With reference to FIG. 14, it is to be understood that that the final configuration of FIG. 12 is merely exemplary and that other embodiments exist in which the trench sidewalls 62, the liner sidewalls 73 and the metallic interconnect 80' are tapered. For example, as shown in FIG. 14, the trench sidewalls 62, the liner sidewalls 73 and the metallic interconnect 80' can be tapered inwardly with increasing distance from the uppermost surface 523 of the main body 521. This tapering can result, in some cases, from the processes used in the formation of the trench 60, the liner 70 and the metallic interconnect 80' (e.g., etch and deposition processes).

With reference to FIG. 15, a device 90 can be provided with multiple lower metallization levels 91, caps 92 disposed on each of the lower metallization levels 91 and an upper metallization level 93 disposed on the uppermost one of the caps 92. As shown in FIG. 15, the multiple lower metallization levels 91 are provided in a similar configuration as the lower metallization level 50 of FIGS. 7-13, the caps 92 are provided in a similar configuration as the cap 51 of FIGS. 7-13 and the upper metallization level 93 is provided in a similar configuration as the upper metallization level 52 of FIGS. 7-13.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a low aspect ratio interconnect, the method comprising:
    depositing a metallization layer on a cap, the metallization layer comprising only ultra, low-k (ULK) dielectric material defining a trench with a bottom wall recessed from a plane of an uppermost surface of the ULK dielectric material and sidewalls extending from the uppermost surface of the ULK dielectric material to the bottom wall,
    depositing liner material on the sidewalls and the bottom wall to form a liner;
    depositing the liner material directly on the uppermost surface of the ULK dielectric material to form an upper portion of the liner, and
    polishing metallic interconnect material such that a plane of a resulting uppermost surface of a metallic interconnect is closer to a plane of an uppermost surface of the upper portion of the liner than a plane of the uppermost surface of the ULK dielectric material;
    stopping the polishing once the plane of the resulting uppermost surface of the metallic interconnect is closer to the plane of the uppermost surface of the upper portion of the liner than the plane of the uppermost surface of the ULK dielectric material; and
    etching the liner material at the upper portion of the liner and the metallic interconnect material at the uppermost surface of the metallic interconnect to only the uppermost surface of the ULK dielectric material.

2. The method according to claim 1, wherein the polishing comprises chemical mechanical polishing (CMP) and the etching of the liner material and the metallic interconnect material comprises a wet etching of the liner material and the metallic interconnect material selective to the ULK dielectric material.

3. The method according to claim 1, further comprising seeding and electroplating the metallic interconnect material over the liner.

4. The method according to claim 3, wherein:
    the trench is formed by a process that comprises a reactive ion etch (ME), and
    the seeding and electroplating comprises physical vapor deposition (PVD).

5. The method according to claim 3, wherein the trench, liner sidewalls and the metallic interconnect are tapered.

6. The method according to claim 1, further comprising:
forming a lower interconnect layer with a lower trench, a lower trench liner and a lower metallic interconnect;
depositing a cap on the lower interconnect layer; and
disposing the metallization layer on the cap.

7. The method according to claim 1, wherein the liner material comprises tantalum nitride and cobalt.

8. The method according to claim 1, further comprising forming the liner with multiple layers of different materials.

9. The method according to claim 1, wherein the metallic interconnect material comprises one or more of copper, cobalt and ruthenium.

10. The method according to claim 1, wherein no further liner or metallic interconnect material is removed following the etching of the liner material to only the uppermost surface of the ULK dielectric material.

11. A method of forming a device with multiple low aspect ratio interconnects, the method comprising:
forming multiple lower interconnect layers with lower trenches, lower trench liners and lower metallic interconnects;
depositing a cap on each of the multiple lower interconnect layers;
disposing a metallization layer on an uppermost cap, the metallization layer comprising only ultra, low-k (ULK) dielectric material defining a trench with a bottom wall disposed above a plane of a lowermost surface of the ULK dielectric material and recessed from a plane of an uppermost surface of the ULK dielectric material, the plane of the uppermost surface of the ULK dielectric material being disposed above the plane of the lowermost surface of the ULK dielectric material by an initial height, and sidewalls extending from the uppermost surface of the ULK dielectric material to the bottom wall,
depositing liner material on the sidewalls and the bottom wall to form a liner;
depositing the liner material directly on the uppermost surface of the ULK dielectric material to form an upper portion of the liner, and
disposing metallic interconnect material over the liner and the upper portion of the liner;
polishing the metallic interconnect material such that a plane of a resulting uppermost surface of a metallic interconnect is closer to a plane of an uppermost surface of the upper portion of the liner than a plane of the uppermost surface of the ULK dielectric material;
stopping the polishing once the plane of the resulting uppermost surface of the metallic interconnect is closer to the plane of the uppermost surface of the upper portion of the liner than the plane of the uppermost surface of the ULK dielectric material; and
etching the liner material at the upper portion of the liner and the metallic interconnect material at the uppermost surface of the metallic interconnect only to the uppermost surface of the ULK dielectric material,
wherein the etching of the liner material and the metallic interconnect material comprises a wet etching of the liner material and the metallic interconnect material selective to the ULK dielectric material and results in a final structure in which:
terminal edges of the liner material and a newly resulting uppermost surface of the metallic interconnect are coplanar with the plane of the uppermost surface of the ULK dielectric material which remains disposed above the plane of the lowermost surface of the ULK dielectric material by the initial height.

12. The method according to claim 11, wherein the polishing comprises chemical mechanical polishing (CMP).

13. The method according to claim 11, wherein no further liner or metallic interconnect material is removed following the etching of the liner material to only the uppermost surface of the ULK dielectric material.

\* \* \* \* \*